(12) United States Patent
Ketterer et al.

(10) Patent No.: US 7,847,792 B2
(45) Date of Patent: Dec. 7, 2010

(54) SIMPLE INTEGRATED CONTROL FOR ZOOM/PAN FUNCTIONS

(75) Inventors: Scott R. Ketterer, Beaverton, OR (US); Lance H. Forsberg, Beaverton, OR (US); Lynne A. Fitzsimmons, Portland, OR (US); Evan A. Dickinson, Portland, OR (US); Steven C. Herring, Beaverton, OR (US); Kenneth P. Dobyns, Beaverton, OR (US); Keith D. Rule, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1197 days.

(21) Appl. No.: 11/478,521

(22) Filed: Jun. 28, 2006

(65) Prior Publication Data

US 2007/0035658 A1    Feb. 15, 2007

(51) Int. Cl.
*G06F 3/033*   (2006.01)
(52) U.S. Cl. .................. 345/184; D10/76; 324/76.11; 324/76.81; 345/440.1; 702/68; 702/127; 715/723; 715/784
(58) Field of Classification Search ............. None
See application file for complete search history.

(56) References Cited

U.S. PATENT DOCUMENTS 4,794,388 A * 12/1988 Matthews ............... 345/661
6,118,444 A *  9/2000 Garmon et al. ........... 715/723
6,229,536 B1   5/2001 Alexander et al.
6,278,268 B1 *  8/2001 Jaffe .................... 324/121 R (Continued)

OTHER PUBLICATIONS

Shibuya M.: "DL2700 Multichannel, Long-Recording Digital Oscilloscope", Internet Article, [online] Sep. 28, 2000, pp. 5-9, XP002410397, URL:https://yokogawa.com/rd/pdf/TR/rd-tr-r00024-002.pdf, p. 8; figures 1-3.
DL9000 Digital Oscilloscope User's Manual, 1st Edition, Jun. 2005, Copyright 2005, Yokogawa Electric Corporation, p. i, Manual Foreward; and p. 1-1, Chapter 1, Names and Functions of Parts.

*Primary Examiner*—Amare Mengistu
*Assistant Examiner*—Antonio Xavier
(74) *Attorney, Agent, or Firm*—Francis I. Gray; Thomas F. Lenihan

(57) ABSTRACT

A simple, integrated control for pan and zoom of a display of data represented by a very long data record is in the form of a control knob having an outer ring for controlling pan and an inner knob for controlling a zoom factor. A zoom function is turned ON either by turning the inner knob (setting the zoom factor to a default value) or by (i) pressing an adjacent zoom or pan button or (ii) turning the outer ring (setting the zoom factor to a prior value when the zoom function was turned OFF). The zoom function may be turned OFF by turning the inner knob to set the zoom factor to 1× or by pressing the zoom button. The outer ring has individual positions divided into two groups: one group for controlling pan rate within a zoom window displaying a portion of the very long data record defined by a zoom box within a main window displaying the very long data record; and the other group for controlling pan rate of the zoom box within the main window for rapid movement from one end of the record to another.

9 Claims, 3 Drawing Sheets

U.S. PATENT DOCUMENTS

| | | |
|---|---|---|
| 7,441,193 B1 * | 10/2008 | Wild et al. .................. 715/733 |
| 2002/0126099 A1 | 9/2002 | Engholm |
| 2003/0016248 A1 * | 1/2003 | Ubillos ....................... 345/800 |
| 2003/0030634 A1 * | 2/2003 | Sang'udi et al. ............ 345/418 |
| 2004/0252109 A1 * | 12/2004 | Trent et al. .................. 345/174 |
| 2006/0028454 A1 * | 2/2006 | Branton et al. .............. 345/173 |

* cited by examiner

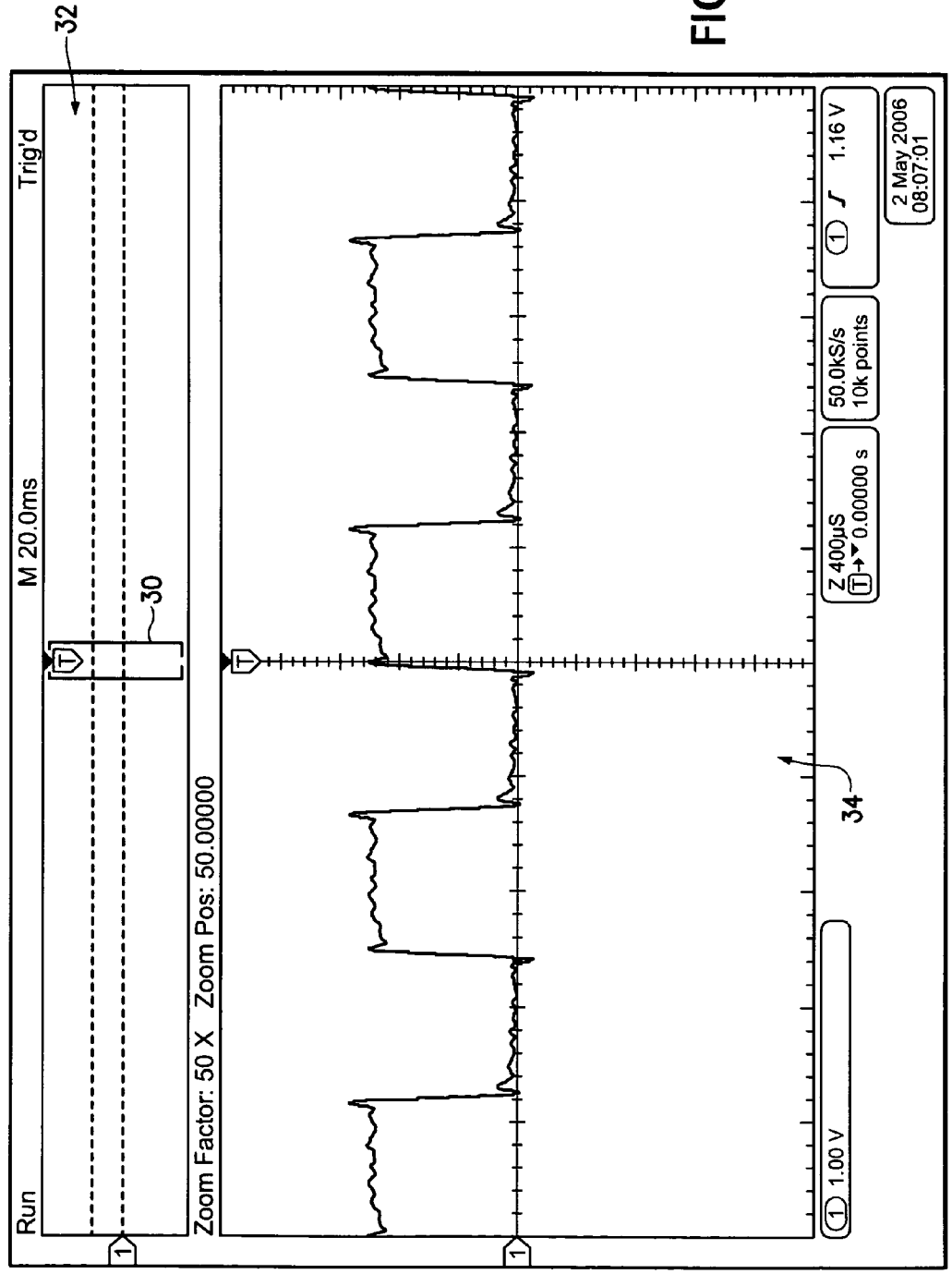

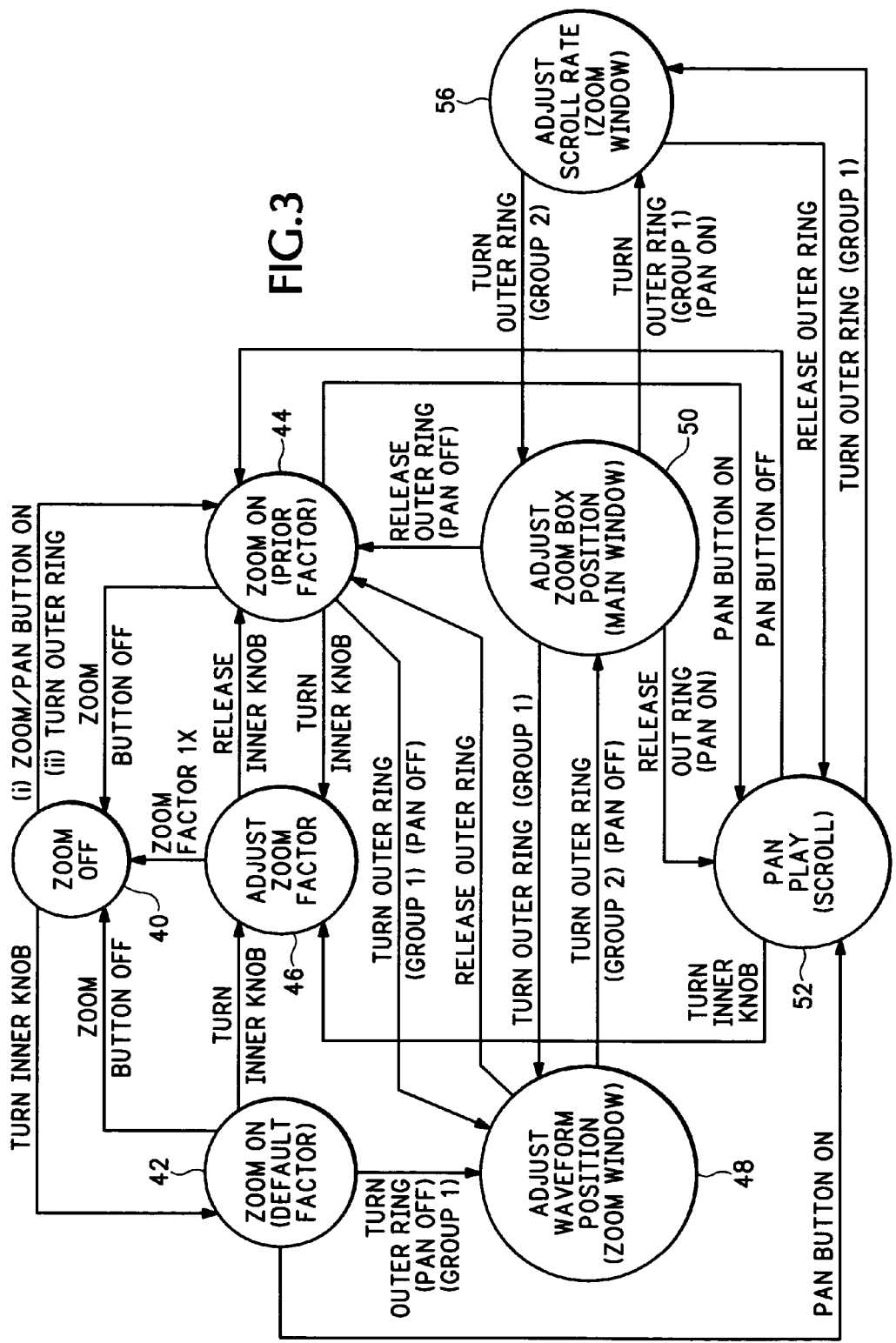

SIMPLE INTEGRATED CONTROL FOR ZOOM/PAN FUNCTIONS

BACKGROUND OF THE INVENTION

The present invention relates to manipulation of waveforms on a display, and more particularly to a simple, integrated control for zoom and pan functions for instruments having a very long data record.

The notion of "zoom" for waveform displays on test and measurement instruments, such as oscilloscopes, has been around a long time. Tektronix, Inc., an Oregon corporation headquartered in Beaverton, Oreg., has oscilloscopes with two separate controls for zoom—one for zoom position and another for zoom factor. An "auto-scroll" feature also exists on high performance oscilloscopes. With the auto-scroll feature a user has the ability to adjust the speed and direction of scrolling or panning.

Introducing a very long data record, such as up to 25 megasamples, into a value oscilloscope allows a zoom factor of 25,000× magnification without interpolation assuming a display width of 1000 pixels. At these large magnification factors zoom navigation either becomes too slow to make large jumps in location within the very long data record, or it becomes too fast to make fine adjustments. To counter this problem the TDS3000 digital storage oscilloscope, manufactured by Tektronix, Inc., uses knob acceleration and also moves a zoom box faster across a display of the very long data record if the zoom magnification factor is small. If the user is closely zoomed in (20×), to make a large jump to another location within the very long data record the user zooms out (2×), adjusts the position of the zoom box on the very long data record, and then zooms back in (20×). This process is not very intuitive and also involves intermediate steps. While a jog/shuttle knob design is commonplace, it has not been used to control a zoom box on a display.

Also in using the oscilloscope's zoom feature the user wants as much time as possible spent in looking at the zoomed waveform on the display represented by the very long data record, not in finding controls to control the zoom. What is desired is a zoom control that is both intuitive and operated by feel alone.

BRIEF SUMMARY OF THE INVENTION

Accordingly the present invention provides a simple, integrated control for zoom and pan functions within a very long data record. The control is in the form of a control knob having an outer ring to control pan and an inner knob to control zoom factor. Also adjacent the control knob are zoom function and pan function buttons. A zoom function is turned ON either by turning the inner knob (setting the zoom factor to a default value), or by (i) pressing the adjacent zoom or pan button or (ii) turning the outer ring (setting the zoom factor to a prior value when the zoom function was turned OFF). The zoom function may be turned OFF by turning the inner knob to set the zoom factor to unity (zoom factor=1×) or by pressing the zoom button. The outer ring has individual positions divided into two groups that control the direction and panning of (i) a waveform display within a zoom window representing a subset of the very long data record (group 1 nearest a neutral position) and (ii) a zoom box within a main window displaying the entire very long data record (group 2 farthest from the neutral position). The outer ring is turned through the individual positions to select the rate of pan within the zoom window displaying the subset of the very long data record (group 1) or within the main window displaying the entire very long data record (group 2). With pan activated by pressing the pan button, the waveform automatically scrolls across the zoom window, with the rate controlled by the first group of positions of the outer ring, or the zoom box is moved across the very long data record in the main window, with the rate controlled by the second group of positions of the outer ring. Release of the outer ring causes the pan rate to remain constant at the last rate selected determined by the first group of positions to which the outer ring was turned.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 2 is a plan view of a typical waveform display where zoom and pan functions are controlled by the control knob according to the present invention.

FIG. 3 is a state diagram view of the simple, integrated control for zoom and pan functions according to the present invention.

DETAILED DESCRIPTION OF THE INVENTION

Figure 1:
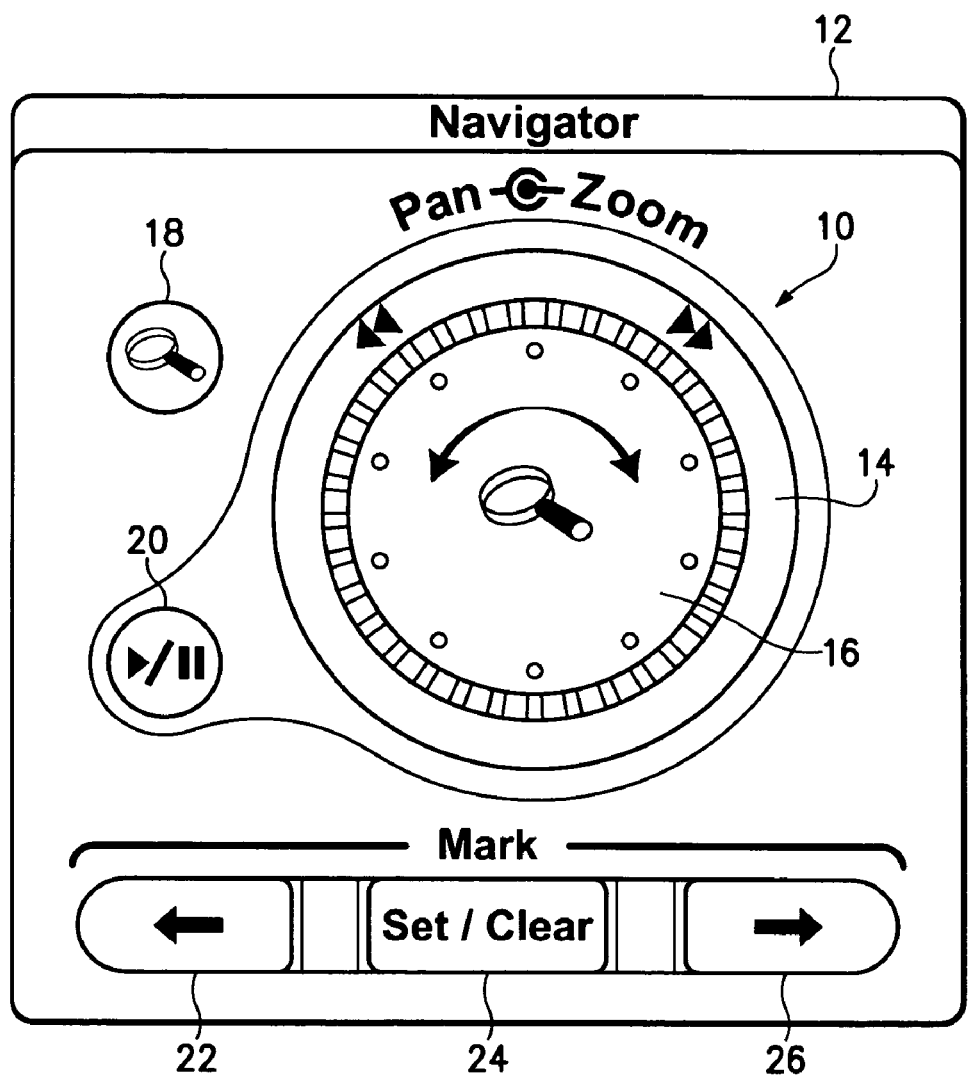
FIG. 1 is a plan view of a simple, integrated control for zoom and pan functions in the form of a control knob according to the present invention.

Referring now to FIG. 1 a control knob 10 for pan and zoom is shown mounted on part of a control panel 12 of a test and measurement instrument that displays waveforms, such as an oscilloscope. In the described embodiment an outer ring 14 is used to adjust zoom position and pan rate across a very long data record. The outer ring 14 controls the position of a zoom box 30 within a main window 32 displaying the very long data record, as shown in FIG. 2, and a pan rate at which the zoom box moves. An inner knob 16 is used to control zoom factor. The outer ring 14 is spring-loaded with multiple positions each way (although the user doesn't necessarily feel the individual positions). For example, with seven positions each side of a neutral position, this results in fifteen individual positions (7×2+1 for the middle). The farther the user turns the outer ring 14 in one direction, the faster the zoom box 30 travels in that direction within the main window 32. In software as shown in FIG. 3 the individual positions are interpreted one of two ways: (i) a first group of positions of the outer ring 14 nearest the neutral position are interpreted as "pan rate (pixels per unit time) inside the zoom window" meaning that, while a waveform 31 in a zoom window 34 moves at the same speed, the zoom box in the main window 32 moves slower the more the user is zoomed in, i.e., the greater the zoom factor; and (ii) a second group of positions of the outer ring farthest from the neutral positions are interpreted as "pan rate (pixels per unit time) of the zoom box in the main window" meaning that, no matter what the zoom factor is, the zoom box in the main window travels at the same rate for the same outer ring positions while the waveform in the zoom window seems to travel faster the more the user is zoomed in.

As an example, when the outer ring 14 is turned to a first ring position from the neutral point: (i) for a zoom factor of 2× the first position seems to move the waveform displayed in the zoom window 34 at a rate of x pixels per unit time while the zoom box 30 in the main window 32 moves at a rate of y pixels per unit time, y=1/2x; and (ii) for a zoom factor of 50× the first outer ring position seems to move the waveform displayed in the zoom window at the same rate of x pixels per unit time while the zoom box in the main window moves 25× slower. Separating the individual positions on the outer ring 14 into the two groups—zoom window speed and main window speed—allows the user to make fine adjustments to the waveform 31 displayed inside the zoom window 34 (zoom window speed) while also allowing the user to make large jumps from one portion of the very long data record to another (main window speed). In other words the first group of positions nearest the neutral position provide constant waveform 31 movement in the zoom window 34 so that, for example, one position may be five pixels per second, the next position may be 25 pixels per second, etc., and these speeds are independent of zoom factor. At the second group of positions are constant zoom box 30 speeds in the main window 32, again independent of zoom factor. In this way it feels that the user has direct control of the waveform 31 in the zoom window 34, or of the zoom box 30 in the main window 32 respectively.

Another feature of the integrated zoom control is the ability to enter and exit zoom. If zoom is OFF, one click of the inner knob 16 turns zoom ON. When zoom is ON, spinning the zoom factor in one direction decreases the zoom factor and finally turns zoom OFF when the zoom factor reaches unity (zoom factor=1×). Spinning the inner knob 16 in the other direction increases the zoom factor up to the maximum capability of the system. Although using the inner knob 16 is handy to turn zoom ON, it also causes the user to lose a prior zoom factor. Using the inner knob 16 to turn zoom ON causes the zoom factor to be set to a default low number, such as 2×. An additional zoom button 18 solves this issue. Using the zoom button 18 the user may quickly turn zoom ON and OFF while retaining the zoom factor through those transitions.

A pan/pause button 20 just to the left of the control knob 10 provides easy access to the ability to automatically pan the zoom box 30 across the very long data record in a "play" mode, and the outer ring 14 acts as a speed control for the rate of pan. The pan/pause button 20 is placed close to the control knob 10 to indicate a close relationship to zoom. Also the pan/pause button 20 acts to turn zoom ON when zoom is OFF in the same manner as the zoom button 18.

FIG. 3 shows that a zoom OFF state 40 transitions to a zoom ON state 42, 44 by turning the inner knob 16 (state 42), or by either turning the outer ring 14 or pressing either of the zoom or pan/pause buttons 18, 20 "on" (state 44). When the inner knob is turned after zoom is ON, the adjust zoom factor state 46 is entered. After the zoom factor is adjusted, the system returns to the zoom ON state 44. The zoom OFF state 40 may be entered from the adjust zoom factor state 46 by adjusting the zoom factor to 1×. When the inner knob 16 stops turning, the zoom ON state 44 stores the current zoom factor as the prior zoom factor. Pressing the zoom button 18 "off" when zoom is ON always returns to the zoom OFF state 40. Turning the outer ring 14 when zoom is ON and pan is OFF enters an adjust position state 48 in the zoom window 34, the positioning rate being a function of the number of positions from neutral the outer ring is turned. When the outer ring 14 is turned farther, an adjust zoom box state 50 for the main window 32 is entered. Turning the outer ring 14 back returns to the adjust position state 48 for the zoom window 34. Releasing the outer ring 14 returns to the zoom ON state 44.

From either of the zoom ON states 48, 50, pressing the pan button 20 "on" enters a pan "play" state 52 where the waveform automatically scrolls across the display in the zoom window 34, with the zoom box 30 moving correspondingly in the main window 32. Pressing the pan button 20 "off" pauses the scrolling and returns to the zoom on state 44, and pressing the pan button "on" re-enters the pan play state 52 with the prior pan rate. From the pan play state 52 turning the outer ring 14 through the first set of positions enters an adjust pan rate state 56 where a pan rate for the zoom window 34 is selected. If the outer ring 14 is turned farther, then the zoom box 30 is moved rapidly in the main window 32 from one position to another within the very long data record (state 50). Turning the outer ring 14 back to the earlier positions returns to the adjust pan rate state 56. In either situation releasing of the outer ring 14 when the pan button 20 is "on" returns to the pan play state 52.

Three Mark buttons 22, 24, 26, as described in co-pending U.S. Patent Application Ser. No. 60/707,736, are located close to the control knob 10 in order to provide an easy way to jump the zoom box from one marked location within the very long data record to another.

Many previous zoom controls either multiplexed knobs or forced the user to enter a menu to control zoom. This forces the user to stop thinking about the zoomed waveform in order to access the controls needed. As shown in FIG. 1 all the zoom controls—zoom button 18, control knob 10, pan/pause button 20, set/clear mark button 24, next mark button 26, and previous mark button 22—are all centrally located conveniently on the front panel 12 of the oscilloscope in close proximity to each other. This allows the user to completely control all aspects of zoom by feel without having to look over at the knobs and buttons so that the user maintains focus on the waveform display, intuitively guiding his waveform on the display to any desired position.

Although the described embodiment uses a control knob with an outer ring to control pan and an inner knob to control zoom, the functions of the respective elements of the control knob may be reversed, i.e., the outer ring could control zoom factor and the inner knob could control pan. Also other unitary constructions other than a control knob may be used, such as sliders, touchpads or the like, so long as there are two elements—one for controlling zoom factor and the other for controlling pan—that may be manipulated by feel.

Thus the present invention provides a simple, integrated control for zoom and pan in the form of a zoom/pan knob with the layout of all zoom controls being presented to the user in a very intuitive, cohesive and easy to use model—one that the user can use without thinking about it or even looking at it.

What is claimed is:

1. A simple, integrated control for zoom and pan of a data record comprising a unitary control device having a first element for controlling pan of a zoom box within a main window of a display showing the data record and a second element for controlling a zoom factor;

wherein the unitary control device comprises a control knob having an outer ring as one of the first and second elements and an inner knob for the other of the first and second elements;

wherein the outer ring comprises a plurality of individual positions, each individual position indicating a direction of pan and a pan rate; and wherein the individual positions are divided into two groups, one group controlling pan rate within a zoom window displaying a portion of the data record defined by the zoom box and the other group controlling pan rate of the zoom box within the main window.

2. The control as recited in claim 1 further comprising:

means for turning ON a zoom function when the control knob is initially turned and the zoom function is OFF, subsequent turning of the inner knob controlling the zoom factor; and means for turning OFF the zoom function when the inner knob is turned to produce a unity zoom factor.

3. The control as recited in claim 2 wherein the zoom factor comprises a default zoom factor when the inner knob is initially turned to turn the zoom function ON.

4. The control as recited in claim 1 further comprising a zoom button located adjacent the control knob for turning the zoom function ON and OFF.

5. The control as recited in claim 4 wherein the zoom button comprises means for setting the zoom factor to a prior zoom factor when turning the zoom function ON, the prior zoom factor being the zoom factor when the zoom function was turned OFF.

6. The control as recited in claim 1 further comprising a pan button located adjacent the control knob for pausing and resuming pan.

7. The control as recited in claim 6 wherein the pan button comprises means for turning ON a zoom function when the pan button is pressed ON.

8. The control as recited in claim 6 wherein when the pan button is ON the outer ring comprises a plurality of individual positions, each individual position indicating a scroll direction and scroll rate.

9. The control as recited in claim 8 wherein the individual positions are divided into two groups in each direction from a neutral position, one group controlling the scroll rate and direction within a zoom window displaying a portion of the data record defined by the zoom box and the other group controlling scroll rate and direction of the zoom box in the main window.

* * * * *